United States Patent
Iijima et al.

(10) Patent No.: US 7,740,773 B2
(45) Date of Patent: Jun. 22, 2010

(54) CONDUCTIVE COMPOSITION AND CONDUCTIVE PASTE

(75) Inventors: Motoki Iijima, Nagoya (JP); Tatsuro Nishimura, Nagoya (JP); Masayuki Nakanishi, Ise (JP)

(73) Assignees: Noritake Co., Limited, Nagoya-Shi (JP); Noritake Itron Corporation, Ise-Shi (JP)

( * ) Notice: Subject to any disclaimer, the term of this patent is extended or adjusted under 35 U.S.C. 154(b) by 518 days.

(21) Appl. No.: 11/727,350

(22) Filed: Mar. 26, 2007

(65) Prior Publication Data
US 2007/0228337 A1 Oct. 4, 2007

(30) Foreign Application Priority Data
Mar. 30, 2006 (JP) .............................. 2006-095581

(51) Int. Cl.
H01B 1/02 (2006.01)
H01B 1/22 (2006.01)

(52) U.S. Cl. ............... 252/514; 252/515; 252/519.1; 252/519.13; 252/520.5; 252/521.4

(58) Field of Classification Search ............. 252/514, 252/520.2, 521.5, 519, 519.13, 520.22, 521.4, 252/512
See application file for complete search history.

(56) References Cited

U.S. PATENT DOCUMENTS
2004/0099847 A1 * 5/2004 Miura ..................... 252/500

FOREIGN PATENT DOCUMENTS

| JP | A 3-152837 | 6/1991 |
| JP | A 9-137066 | 5/1997 |
| JP | A 2001-312920 | 11/2001 |
| JP | A 2004-355880 | 12/2004 |
| JP | A 2005-035840 | 2/2005 |

* cited by examiner

Primary Examiner—Steven Bos
Assistant Examiner—Pritesh Darji
(74) Attorney, Agent, or Firm—Oliff & Berridge, PLC

(57) ABSTRACT

The present invention provides a conductive composition and a conductive paste from which a conductive film having a high conductivity and a low thermal expansion coefficient can be formed.

The thermal expansion coefficient of an island fixing type conductive layer 10 is compatible with that of a substrate 12. A cracking of the island fixing type conductive layer 10 or a crack in the substrate 12 due to a difference between these thermal expansion coefficients is suitably inhibited. The thermal expansion coefficient of the island fixing type conductive layer 10 is adjusted by ZWP contained in the range from 10 to 55 (wt %) as a low-expansion filler. Thus, compared with the case where other low-expansion filler is added, the conductivity degradation is inhibited. Accordingly, the island fixing type conductive layer 10 having a high conductivity and a high bonding strength is obtained.

10 Claims, 3 Drawing Sheets

CONDUCTIVE COMPOSITION AND CONDUCTIVE PASTE

BACKGROUND OF THE INVENTION

1. Field of the Invention

The present invention relates to a conductive composition and a conductive paste, which are used for example for a conductive adhesive layer and/or a wiring layer for a circuit substrate, etc., for a vacuum fluorescent display (hereinafter, called as "VFD").

2. Description of Related Art

For example, a conductive layer having a high conductivity is provided over an insulating substrate in order to achieve various objects. For example, in a circuit substrate, a conductive layer is provided in order to form conductive wiring. Furthermore, in a VFD, etc., a conductive adhesive layer provided over a conductive wiring pattern of a substrate is used to fix a grid described below, whereby this grid is connected to conductive wiring.

The VFD is an electronic display device that causes a fluorescent material to emit light. For example, a triode structure composed of a positive electrode (anode), a control electrode (grid) and a filament-like negative electrode (cathode) is provided within a vacuum case formed by airtightly connecting a front plate and a rear plate, each made of glass, to each other via a frame-like spacer, and a fluorescent material is applied onto this anode.

In the VFD, electrons emitted from the cathode are accelerated and controlled due to a potential difference between a grid provided at a height between the cathode and an anode, and the electrons are selectively injected to a fluorescent material layer, thereby causing it to emit light. Such the VFD can realizes a clear display at a low operating voltage and enables color display by preparing fluorescent material layers for emitting different colors of light, and is therefore frequently used, e.g., in audio equipment and a display component for an automobile display panel.

The above-described grid being formed of a metal mesh, etc., and having a planar shape such as a rectangle, is divided for different electrodes, that is, for display patterns controlled at mutually independent timings, to be fixed to a display surface of a substrate. The grid is provided with, at its both ends, leg portions extending toward a rear plate side and being bent, and the grid is fixed onto a grid wiring conductor at these leg portions at rear plate inner face via a conductive adhesive layer.

This conductive adhesive layer is composed of a conductive component such as silver, and a fixing component such as low-melting glass, etc. In fixing the grid, a conductive island fixing type paste is sprayed, i.e., applied to a predetermined position over the grid wiring conductor, a lower end of the leg portion of the grid is pushed onto this paste, and then a calcining process is performed. Thus, a conductive adhesive layer is formed utilizing this paste.

Furthermore, in the above-described circuit substrate, circuit components i.e., parts such as an integrated circuit, a capacitor, a coil and a resistor are also fixed onto the substrate while being connected to a wiring pattern formed on the substrate. Also in fixing these circuit components, each circuit component is placed onto a conductive paste applied to a predetermined position of the wiring pattern, etc., and a heat treatment is performed, whereby a conductive adhesive layer is formed of this paste.

Conventionally, a conductive composition containing lead glass has been used for a conductive adhesive layer a conductive layer for wiring, etc., such as one described above (see, for example, Patent Document 1: Japanese Published Unexamined Patent Application No. H3-152837, and Patent Document 2: Japanese Published Unexamined Patent Application No. H9-137066). A conductive composition containing lead glass has a low melting point and a thermal expansion coefficient approximately equal to that of a soda-lime glass substrate, and therefore has an advantage that a crack is unlikely to occur in the substrate even upon significant temperature change during the manufacturing process and/or during use.

In recent years, from the perspective of environmental contamination prevention and work hygiene, a conductive composition free from lead which is a hazardous substance, has been desired. In view of this, a conductive composition using non-lead low-melting glass which does not contain lead such as borosilicate alkali oxide base lead or $Bi_2O_3$—$B_2O_3$ base lead, has been variously proposed (see, for example, Patent Document 3: Japanese Published Unexamined Patent Application No. 2001-312920, and Patent Document 4: Japanese Published Unexamined Patent Application No. 2004-355880).

Actually, non-lead low-melting glass generally has a thermal expansion coefficient larger than that of lead glass. For example, lead glass has a thermal expansion coefficient of approximately 70 to $80 \times 10^{-7}$(° C.), whereas non-lead low-melting glass has a thermal expansion coefficient of approximately 100 to $140 \times 10^{-7}$(° C.). On the other hand, soda-lime glass has a thermal expansion coefficient of approximately 85 to $90 \times 10^{-7}$(° C.), for example.

Therefore, if lead glass contained in a conventional conductive composition is replaced with a conductive composition containing non-lead low-melting glass as it is, the thermal expansion coefficient of a conductive film (a film that is calcined after formed of a conductive paste) formed of the conductive composition is considerably large compared with that of the substrate composed of soda-lime glass, etc. As a result, in a conductive adhesive layer formed by a conductive composition containing such non-lead low-melting glass, a crack might occur in the substrate upon significant temperature change during the manufacturing process and/or during use.

On the other hand, the conductive composition disclosed in Patent Document 4 described above contains Ag of 10 to 60 (vol %), $Bi_2O_3$—$B_2O_3$ base low-melting glass of 10 to 80 (vol %), ceramic particle of from 0 to 70 (vol %), and metal oxide base pigment of 5 to 10 (vol %). Thus, the conductive composition has a thermal expansion coefficient compatible with the soda-lime glass substrate. The above-described ceramic particle is added to this conductive composition, as a low-expansion filler with a low thermal expansion coefficient, whereby the thermal expansion coefficient of the resulting conductive film is adjusted. Exemplary ceramic particles include zircon having a thermal expansion coefficient of approximately $40 \times 10^{-7}$(/° C.), and zirconium phosphate (hereinafter, called as "ZP") having a thermal expansion coefficient of approximately $20 \times 10^{-7}$(/° C.).

However, the zircon or ZP which is an insulative material is added by large amount in order to sufficiently reduce the thermal expansion coefficient, and there arises the problem that the conductive film formed of the conductive composition has a significantly large resistance value.

SUMMARY OF THE INVENTION

The present invention has been made in view of the above-described circumstances, and an object thereof is to provide a conductive composition and a conductive paste from which a conductive film having a high conductivity and a low thermal expansion coefficient can be formed.

In order to achieve the above object, a conductive composition according to a first invention (recited in claim 1) contains Ag in the range from 20 to 70 (wt %); $Bi_2O_3$—$B_2O_3$ base low-melting glass in the range from 10 to 55 (wt %); and zirconium tungstophosphate (hereinafter, called as "ZWP") in the range from 10 to 55 (wt %).

Furthermore, a conductive paste according to a second invention (recited in claim 10) contains a vehicle containing ethylcellulose in the range from 65 to 98 (wt %) of the whole resin, and rosin resin in the range from 2 to 35 (wt %) of the whole resin; and the conductive composition according to the first invention (recited in claims 1 to 9), which is dispersed in the vehicle.

According to the first invention, the ZWP contained in the conductive composition has a negative thermal expansion coefficient of for example approximately $-32 \times 10^7$(° C.), resulting in that the thermal expansion coefficient of a conductive film formed of the conductive composition is suitably inhibited or suppressed from being increased, compared with a conventional conductive film containing lead glass. This inhibiting effect is obtained even if $Bi_2O_3$—$B_2O_3$ base low-melting glass having a thermal expansion coefficient higher than that of lead glass is contained. Here, if the zircon or ZP is used as the low-expansion filler as in the conventional conductive composition, conductivity of the conductive film to be formed significantly reduces.

In contrast, with use of the ZWP as in the first invention, resistance value increase is inhibited or suppressed even if the contained amount of the ZWP is approximately similar to that of zircon, the reason for which is not clear. Therefore, there is obtained the conductive composition from which a conductive film having a high conductivity and a low thermal expansion coefficient can be formed. Noted is that the above-described value of the thermal expansion coefficient is obtained at 25 to 250(° C.).

Incidentally, use of the ZWP as a filler has been conventionally proposed in a nonconductive sealing material (see for example, Japanese Published Unexamined Patent Application No. 2005-035840). This ZWP is also an insulative material similar to zircon and ZP, and has a volume resistivity as high as approximately $3 \times 10^{13}$ ($\Omega \cdot cm$) for example. Therefore, even if the zircon or ZP is replaced with the ZWP as the filler for a conductive composition, no improvement in the conductivity of a conductive film to be formed will be expected at all. The present inventors conducted studies on various compositions in an attempt to obtain a conductive composition from which a conductive film having a high conductivity and a low thermal expansion coefficient can be formed. As a result, they found that, in a composition containing Ag and $Bi_2O_3$—$B_2O_3$ base glass at a ratio in the above-described range, using ZWP as the filler significantly improves the conductivity, compared with the case where zircon or ZP is used. The first invention of this present application has been made based on these findings.

Noted is that in the composition of the above-described conductive composition, when the contained amount of Ag acting as a basic component for obtaining conductivity is less than 20(%), the resistance value of the conductive film to be formed significantly increases. On the other hand, if the contained amount of Ag exceeds 70(%), the percentage of glass serving as a connecting material becomes too small, so that the insufficient bonding strength to the substrate, etc., generates cracking of the conductive film to be formed, and the resistance value increases. For example, in a grid fixing application in a VFD, the increased resistance value of the conductive film reduces the grid current, which eventually causes the problem of the decreased luminous brightness. Furthermore, in the application where a conductive film is provided inside a vacuum case as in the VFD, conductive particle released from crack floats within a vacuum space to act as an anomalous luminous point in a long time period usage of the VFD, resulting in degradation in display quality.

The $Bi_2O_3$—$B_2O_3$ base low-melting glass serves as a component that is dissolved and solidified to ensure the bonding strength to the substrate, etc. The $Bi_2O_3$—$B_2O_3$ base low-melting glass of the contained amount less than 10(%) makes, the bonding strength to the substrate, etc., insufficient, so that the conductive film suffers from the crack and the resistance value thereof increases. On the other hand, if the contained amount exceeds 55(%), the thermal expansion coefficient of the conductive film to be formed significantly increases, and a crack is likely to occur in the conductive film and/or the substrate, etc., due to the incompatibility between the thermal expansion coefficients of the conductive film and the substrate, etc. In other words, the too large amount of glass makes the reducing effect of the thermal expansion coefficient due to ZWP insufficient.

The ZWP is ceramics represented by the composition formula of $Zr_2(WO_4)(PO_4)_2$ or $2ZrO_2 \cdot WO_3 \cdot P_2O_5$, and is formed as follows. For example, zirconium phosphate ($2ZrO_2 \cdot P_2O_5$) and tungsten oxide ($WO_3$) used as starting materials are subject to wet mixing, then a heat treatment is performed for them at approximately 1200(° C.), thus forming ZWP by solid-phase reaction synthesis. However, the forming method for ZWP is not limited in particular. This ZWP functions as a low-expansion filler for suppressing increase in the thermal expansion coefficient of the conductive film resulted from the $Bi_2O_3$—$B_2O_3$ base low-melting glass. If the contained amount is less than 10(%), the thermal expansion coefficient cannot be sufficiently reduced. On the other hand, the contained amount exceeding 55(%) relatively reduces the amounts of Ag and glass, making difficult to maintain both the bonding strength to the substrate, etc., and the conductivity at a high level.

According to the second invention, since the conductive composition of the first invention is dispersed in the vehicle, obtained is the conductive paste from which a conductive film having both a high conductivity and a low thermal expansion coefficient can be formed.

The conductive paste of the second invention contains, as a resin component, rosin resin in the range of 2 to 35(%) in addition to normally used ethylcellulose, and resultantly has a moderately high viscosity. Therefore, the fluidization and spread of the applied conductive paste over the substrate, etc., are suitably inhibited. Accordingly, spacing from the adjacent conductor pattern, required for the prevention of short circuiting (i.e., conductive leak), can be set small, which results in an advantage that the fineness of the conductor pattern can be improved.

Noted is that among rosin resins, rosin ester is dissolved in a terpineol solvent, but has difficulty in being dissolved in a glycol solvent such as butyl carbitol acetate (BCA). However, since rosin ester tends to solely emulsify, a suitable vehicle is obtained by using rosin ester in combination with polymerized rosin. Even if ethylcellulose is partially replaced with these rosin resins, a conductive paste with a high homogeneity can be obtained by using BCA and terpineol in combination as a principal solvent for the conductive paste because of high compatibilities of both of BCA and terpineol. In other words, as long as the components other than the resin component are appropriately adjusted as needed, no trouble occur even if ethylcellulose is partially replaced with rosin resin.

In addition, since the conductive paste contains rosin resin having a thermal resistance generally higher than that of ethylcellulose, the thermal resistance of the whole resin can be increased. In addition, since the conductive paste contains rosin ester having difficulty in being dissolved in a glycol solvent such as BCA normally used in a glass paste, the dissolution of the whole resin in a glycol solvent is decreased. Also in the usage mode below, dissolving of the resin in the conductive paste due to a solvent contained in a glass paste is suitably inhibited.

Specifically, the usage mode is as follows. After having dried the conductive paste applied onto the substrate, etc., a glass paste is applied onto the formed conductive paste film, dried, and subjected to a calcining process, thus the fixing property of the conductive film being increased. Accordingly, the conductive paste film is inhibited from being re-dissolved and is eventually inhibited from being fluidized and deformed, when the glass paste is applied. Even in the worst or severe case, the deformed conductive paste film is suitably inhibited from being brought into contact with the adjacent pattern and from being short-circuited therewith. In other words, fineness of the conductor pattern can be increased also in such a usage mode.

For example, in fixing a grid in the VFD, there is a case where a conductive film to which a leg portion of the grid is fixed is covered with a glass film, thus increasing the fixing property of the leg portions. When the conductive composition of the first invention and the conductive paste of the second invention are used in such a mode, there is an advantage that occurrence of a defect such as short circuiting is extremely low even upon the fine pattern designing. In other words, the conductive composition of the first invention and the conductive paste of the second invention can naturally be applied to a prevailing wiring layer, and are particularly suitable for grid fixing application in the VFD.

The contained amount of rosin resin is less than 2(%) can not sufficiently inhibit the dissolution and fluidization. In addition, if the contained amount exceeds 35(%), handling and application of the inventive paste to an appropriate thickness become difficult because of the too high viscosity, and the conductivity tends to decrease due to flammability degradation during calcining.

Preferably, Ag is contained at 30(%) or more in the conductive composition and the conductive paste. In such an embodiment, owing to the further increased percentage of the conductive component, the resistance value of the conductive film to be formed can be further reduced. Furthermore, Ag, if contained at 50(%) or less, can further increase the percentage of the glass, so that the occurrence of cracking and increase in the resistance value in the conductive film to be formed can be further inhibited. In other words, Ag is desirably contained in the range from 30(%) or more to 50(%) or less.

Preferably, the $Bi_2O_3$—$B_2O_3$ base low-melting glass is contained at 16(%) or more in the conductive composition and the conductive paste. In such an embodiment, due to further increase in the percentage of the component for ensuring bonding strength, the bonding strength of the conductive film to be formed to the substrate, etc., further increases. As a result, the occurrence of cracking in the conductive film to be formed is further inhibited, and the increase in the resistance value is eventually further inhibited.

Alternatively, the $Bi_2O_3$—$B_2O_3$ base low-melting glass is contained at 26(%) or less. In such an embodiment, due to a sufficient decrease in the percentage of the glass component having a high thermal expansion coefficient, the thermal expansion coefficient of the conductive film to be formed is further reduced. Resultantly, the thermal expansion coefficient compatibility with the substrate, etc., is further improved. Moreover, due to a further increase in the percentage of the conductive component, the resistance value of the conductive film to be formed can be further reduced. In other words, the $Bi_2O_3$—$B_2O_3$ base low-melting glass is desirably contained in the range from 16(%) or more to 26(%) or less.

Preferably, the ZWP is contained at 20(%) or more in the conductive composition and the conductive paste. In such an embodiment, due to a further decrease in the thermal expansion coefficient of the conductive film to be formed, the thermal expansion coefficient compatibility with the substrate, etc., is further improved. As a result, both the occurrence of crack in the substrate, etc., and the occurrence of cracking in the conductive film to be formed are further inhibited. Alternatively, the ZWP may be contained at 26(%) or less. In such an embodiment, due to a sufficient increase in the percentage of the Ag serving as a conductive component and the glass component serving as a connecting material, not only the resistance value of the conductive film to be formed can be further reduced, but the boding strength to the substrate, etc., can be further increased. In other words, the ZWP is desirably contained in the range from 20(%) or more to 26(%) or less.

Preferably, in the conductive composition, Ag as the main component, the $Bi_2O_3$—$B_2O_3$ base low-melting glass and the ZWP are contained by 90(%) or more in total. In such an embodiment, the sufficiently increased amounts of the Ag serving as a conductive component, the glass serving as a bonding component, and the ZWP serving as a component for adjusting the thermal expansion coefficient outstandingly achieve the effects of the first invention. These main components are further preferably contained at 95(%) or more.

Preferably, Ag having an average particle diameter in the range from 1 to 10 ($\mu$m) is used in the conductive composition and the conductive paste. The average particle diameter of Ag is preferably 1 ($\mu$m) or more in order to obtain a suitable dispersed state in the conductive composition and in the conductive paste, and to reduce the contained amount required for ensuring a desired conductivity as small as possible. Furthermore, the average particle diameter of Ag is preferably 10 ($\mu$m) or less in order to reduce the film thickness as thin as possible while a high conductivity of the conductive film is ensured. The average particle diameter of Ag is further preferably 3 ($\mu$m) or more, and is even further preferably 6 ($\mu$m) or less. Furthermore, not only Ag in spherical particle form or Ag in flake particle form may be used, but a mixture of them is preferably used. A mixing ratio upon mixing is preferably 1:1 by a weight ratio.

Preferably, the ZWP having an average particle diameter in the range from 1 to 50 ($\mu$m) is used in the conductive composition and the conductive paste. In such an embodiment, since the average particle diameter of the ZWP is sufficiently small to the extent that aggregation is unlikely to occur, a suitable dispersed state can be obtained in the conductive composition and the conductive paste. As a result, the thermal expansion coefficient of the conductive film to be formed can be effectively decreased, and the thermal expansion coefficient is suitably inhibited from being varied in the conductive film. In order to obtain these effects, the average particle diameter is further preferably 10 ($\mu$m) or more, and is even further preferably 25 ($\mu$m) or less. Alternatively, ZWP in appropriate particle shape, e.g., in spherical shape or in fractured shape thereof, may be used.

Preferably, the conductive composition may include a reducing agent. As the reducing agent, etc., carbon is preferable. In such an embodiment, inhibition of the oxidization of Ag serving as the conductive component further improves the conductivity of the conductive film to be formed. Furthermore, the reducing agent is preferably contained in the range of 10(%) or less in the conductive composition. This is because the reducing agent is sufficiently effective even if the contained amount thereof is approximately 5(%), but tends to gradually hinder the sintering of Ag if the contained amount thereof exceeds 10(%). In other words, the reducing agent is desirably contained in the range from 5(%) or more to 10(%) or less in the conductive composition.

Noted is that the conductive composition and the conductive paste may include a pigment for coloring the conductive film to be formed. The type of the pigment to be used is not limited in particular, and can be arbitrarily selected from various pigments normally used in the conductive composition. For example, Fe—Cr base composite oxide, Fe—Cr—Mn base composite oxide, and/or Fe—Ni base composite oxide may be used. Furthermore, the pigment is preferably contained in the range of 10(%) or less in the conductive composition. In a preferred embodiment, the reducing agent and the pigment are preferably contained in the range of 10(%) or less in total in the conductive composition, and are further preferably contained at 5(%) or less in total in the conductive composition.

In a preferred embodiment, the conductive composition and the conductive paste include a shrinkage inhibitor. In such an embodiment, the shrinkage resulting from a calcining process performed in forming the conductive film is inhibited to further inhibit occurrence of the cracking in the conductive film. As the shrinkage inhibitor, one that minimizes degradation in conductivity and has a high shrinkage inhibiting effect is preferable, Al being used, for example. Furthermore, the amount of the shrinkage inhibitor is preferably small to the extent so that sufficient effects can be achieved so as to ensure large contained amounts of Ag, glass and ZWP serving as the main components as much as possible. For example, the shrinkage inhibitor is preferably contained at 10(%) or less in the conductive composition.

Incidentally, the shrinkage resulting from the calcining process performed in forming the conductive film is a part of the reason for cracking of the conductive film, and in particular, the shrinkage amount of the Ag serving as the conductive component during the sintering process greatly affects the cracking of the conductive film. For this reason, the shrinkage inhibitor such as one described above is preferably used to control the sintering shrinkage of the conductive film.

The rosin resin contained in the conductive paste of the second invention is not limited in particular. Hydrogenated rosin, polymerized rosin, rosin ester, etc., may be used, among which rosin ester is preferable. However, since rosin ester tends to emulsify when it is solely used, rosin ester is particularly preferably used in combination with polymerized rosin to increase stability. As the rosin ester, rosin ester maleate may be used, for example.

BEST MODE FOR CARRYING OUT THE INVENTION

Hereinafter, one embodiment of the present invention will be described in detail with reference to the drawings. It should be noted that, in FIGS. 1 through 5, the embodiment described below is appropriately simplified or modified, and the dimension ratio, shape, etc., of each portion are not necessarily accurately shown.

Figure 1:
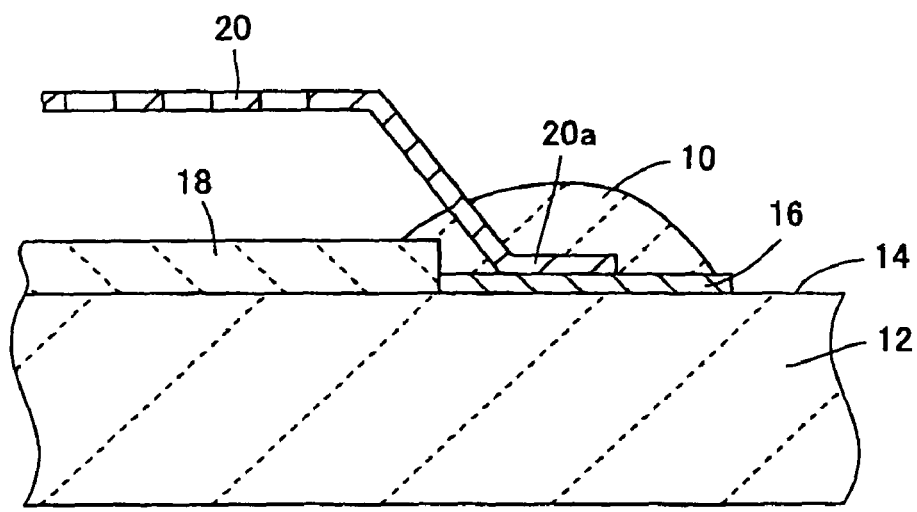
FIG. 1 is a cross-sectional view schematically showing vicinity of a leg portion of a VFD grid, to which a conductive composition and a conductive paste according to the present invention are exemplarily applied, with a bonded part enlarged.

FIG. 1 is a cross-sectional view showing a principal part of a VFD in which an island fixing type or internally supporting type conductive layer 10 is formed by a conductive composition according to one embodiment of the present invention. In FIG. 1, a substrate 12 is a flat plate made of soda-lime glass, etc. The substrate 12, located within a vacuum space, is provided with a wiring layer 16, an insulator layer 18, and a grid electrode 20 over a surface 14 thereof. Noted is that in FIG. 1, a rectangular frame-like spacer glass and a cover glass plate formed of a transparent glass flat plate, which are connected onto the substrate 12 by glass sealing so as to form a longitudinally flat box-like vacuum case, are not shown. In addition, although the conductive composition of the present invention is applied to a known VFD provided with the grid electrode 20, a detailed description of the VFD is omitted.

The wiring layer 16 is formed of, for example, a thin aluminum film or a thick film conductor with thickness dimension of approximately 15 ($\mu$m), and is provided to have a planar shape in accordance with shapes of a large number of the grid electrodes 20 and fluorescent material layers (not shown) provided over the substrate 12. In FIG. 1, there is shown a part of the wiring layer 16, i.e., a portion of a grid wiring conductor, serving as a grid fixation portion to which a leg portion 20a of the grid electrode 20 is fixed.

The above-described insulator layer 18 is a thick film insulator composed of a low-melting glass containing a black pigment, etc., and is provided approximately over the entire surface 14 of the substrate 12 except a portion at which the wiring layer 16 should be exposed so as to have a thickness dimension of approximately 30 to 40 ($\mu$m), etc.

The grid electrode 20 is formed by SUS 304, etc., and includes the leg portions 20a, 20a at both ends of, e.g., a rectangular metallic mesh-like thin plate. The grid electrode 20 is supported by its leg portions 20a, 20a, and thus a mesh part is located apart from the surface 14 of the substrate 12.

The island fixing type conductive layer 10 is composed of a conductive component, a connecting component, a filler, etc. Each leg portion 20a of the grid electrode 20 is securely connected to the grid fixation portion via this island fixing type conductive layer 10 with an extremely small contact resistance. For example, the resistance value over the substrate 12 from the wiring layer 16 to the grid electrode 20 is as low as less than 1($\Omega$). Furthermore, the leg portion 20a exhibits a high fixation strength corresponding to a tensile strength as high as 200 (gf)≈1.96(N) or more. Furthermore, the thickness dimension of the island fixing type conductive layer 10 is slightly greater than that of the insulator layer 18, for example.

The island fixing type conductive layer 10 contains Ag, serving as a conductive component, in the range from 20 to 70 (wt %), e.g., at approximately 30 (wt %). Furthermore, $Bi_2O_3$—$B_2O_3$ base low-melting glass, serving as a connecting component, is contained in the range from 10 to 55 (wt %), e.g., at approximately 18 (wt %). Similarly to lead glass that has been conventionally used, this $Bi_2O_3$—$B_2O_3$ base low-melting glass is a low-melting glass capable of being calcined at a comparatively low temperature of approximately 400 to 550(° C.), for example. However, the thermal expansion coefficient of the low-melting glass is approximately 100 to $140 \times 10^{-7}$(° C.), which is remarkably higher than that of soda-lime glass serving as a constituent material of the substrate 12.

The ZWP serving as the filler is contained in the range of 10 to 55 (wt %), e.g., at approximately 21 (wt %), and has average particle diameter in the range from 1 to 50 (μm), e.g., approximately 20 (μm). This ZWP has a negative thermal expansion coefficient of, etc., approximately $-32 \times 10^{-7}$(° C.) at a temperature in the range from 25 to 250(° C.).

In the island fixing type conductive layer 10, although the $Bi_2O_3$—$B_2O_3$ low-melting glass having the large thermal expansion coefficient is used as the connecting component, an increase in the overall thermal expansion coefficient is inhibited by the ZWP. In other words, the low-expansion filler is added to the ZWP in order to reduce the thermal expansion coefficient of the overall composition. Thus, the island fixing type conductive layer 10 has an overall thermal expansion coefficient of approximately 70 to $80 \times 10^{-7}$(° C.), which is equivalent to that of the conventional lead glass and approximately equal to that of the substrate 12. The low-expansion filler, generally acts to reduce the conductivity of the conductive composition, does not act in such manner in the present embodiment, so that the island fixing type conductive layer 10 has the high conductivity.

In short, according to the present embodiment, since the thermal expansion coefficient of the island fixing type conductive layer 10 is compatible with that of the substrate 12, the cracking of the island fixing type conductive layer 10 or the crack in the substrate 12 due to difference between these thermal expansion coefficients is suitably inhibited. In addition, the island fixing type conductive layer 10 is adjusted in its thermal expansion coefficient, by containing the ZWP in the range from 10 to 55 (wt %) as the low-expansion filler. Thus, compared with the case where other low-expansion filler is added, so that the conductivity reduction is inhibited, and the island fixing type conductive layer 10 having the high conductivity and the high bonding strength is obtained.

In the island fixing type conductive layer 10 of the present embodiment, the $Bi_2O_3$—$B_2O_3$ base low-melting glass, serving as the connecting component, is sufficiently contained in the range from 10 to 55 (wt %) as described above, so that the fixation strength of the grid electrode 20 is sufficiently as high as 2(N) or more. On the other hand, in the conventional island fixing type conductive layer to which zircon and/or zirconium phosphate are/is added as the low-expansion filler, even upon small added amount such as approximately 21 (wt %) being selected, for example, the resistance value between the wiring layer 16 and the grid electrode 20 reaches as high as 100(Ω) or more. Accordingly, maintaining the sufficient conductivity is difficult.

In addition, since zircon has the considerably high thermal expansion coefficient compared with ZWP, even if the added amount thereof is selected substantially equal to that of ZWP as described above, sufficiently achieving the reducing effect of the thermal expansion coefficient is difficult. However, when the contained amount of zircon is further increased in order to sufficiently reduce the thermal expansion coefficient and suppress the island fixing type conductive layer cracking and the substrate crack, the resistance value is further increased. For theses reasons, it is difficult for the island fixing type conductive layer to be compatible with the substrate, with the reduced thermal expansion coefficient while maintaining the high conductivity.

Figure 2:
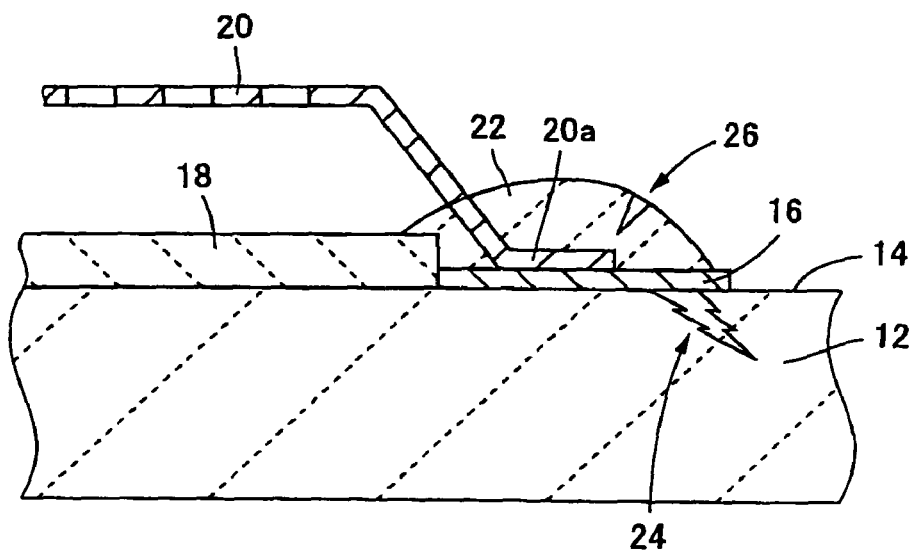
FIG. 2 is a cross-sectional view, which corresponds to FIG. 1, for describing the problem in the case where a conductive composition and a conductive paste, to which no low-expansion filler is added, are used.

FIG. 2 shows the state where an island fixing type conductive layer 22 is formed by using a conductive composition containing no low-expansion filler or a small amount thereof If the thermal expansion coefficient is not sufficiently reduced by the low-expansion filler, due to difference between the thermal expansion coefficients of a substrate 12 and the island fixing type conductive layer 22, not only a crack 24 is likely to occur in the substrate 12, but a cracking 26 is likely to occur also in the island fixing type conductive layer 22. Because of the large thermal expansion coefficient of $Bi_2O_3$—$B_2O_3$ base low-melting glass, addition of the low-expansion filler by the sufficient amount is essential.

The island fixing type conductive layer 10 contains carbon, aluminum powder, pigment, etc., in addition to the above-described constituent components. The carbon is contained as the reducing agent at 10 (wt %) or less, e.g., at approximately 3 to 5 (wt %), and preventing Ag serving as the conductive component from being oxidized to degrade conductivity during calcining. Furthermore, the aluminum powder is contained as the shrinkage inhibitor at 10 (wt %) or less, e.g., at approximately 3 (wt %), and inhibits cracking from occurring due to an excessive shrinkage of Ag during calcining. Furthermore, the pigment includes Fe—Cr base composite oxide, etc., contained at 10 (wt %) or less, e.g., at approximately 2 to 4 (wt %) in order to impart a desired color to the island fixing type conductive layer 10.

The island fixing type conductive layer 10 is formed in the following manner, for example. Specifically, first, in a preparing process, Ag powders, $Bi_2O_3$—$B_2O_3$ base low-melting glass powders, a reducing agent, a low-expansion filler, Al powders and a vehicle are weighed and prepared in accordance with predetermined preparation specifications. For example, the Ag powders composed of the spherical powder particles and flake powder particles both having an average particle diameter of approximately 1 to 10 (μm) and being mixed at a weight ratio of 1:1.

The $Bi_2O_3$—$B_2O_3$ base low-melting glass powders are composed of powders each having an appropriate particle diameter similar to a conventional one. The reducing agent is composed of carbon powders, and the low-expansion filler is composed of the ZWP with the above-described properties. The Al powders are composed of flake powder particles with an average particle diameter of approximately 1 to 10 (μm), etc., and the pigment is composed of fractured powder particles having an average particle diameter of approximately 0.5 to 5 (μm), for example.

The vehicle is prepared for example by mixing ethylcellulose and rosin resin each serving as the resin component, and BCA and terpineol each serving as the solvent, further with a plasticizer and a dispersant. As the plasticizer for example phthalate ester such as DMP (dimethyl phthalate) or DEP (diethyl phthalate) is suitable. As the rosin resin, rosin ester, or a mixture of rosin ester and polymerized rosin mixed at a ratio of 1:1 is suitable.

In a subsequent mixing step, the above-described weighed materials are slightly mixed using a mixer, etc. Next, in a kneading step, the mixed materials are subjected to a kneading process for approximately 15 to 30 minutes for example, by using a kneader such as a three-roll mill. Thus, the conductive paste in which the conductive composition composed of the Ag powders, glass powders, filler, etc., is dispersed within the vehicle is prepared.

In a subsequent applying process, the substrate 12 with the wiring layer 16 formed on the surface 14 is prepared, on which the above-described conductive paste is applied to a predetermined position. Next, in a leg portion burying process, the grid electrode 20, which has been fabricated separately, is placed over the substrate 12 so that the leg portion 20a thereof is located on the conductive paste, thus the leg portion 20a being buried into the conductive paste.

In a drying step, the substrate 12, the insulator layer 18, the grid electrode 20, etc., are subjected to a drying process at approximately 120(° C.) for example in an oven, and are then subjected to a calcining process in a continuous calcining furnace in a calcining step. The calcining conditions are appropriately determined in accordance with the type of the glass powders, etc. For the calcining process, a maximum retention temperature of 480(° C.), and the retention time of approximately 10 minutes at the maximum retention temperature are selected. With this, the glass component within the conductive paste is dissolved and hardened, and the Ag powders are mutually connected. Thus, the above-described island fixing type conductive layer 10 is formed to fix the grid electrode 20 onto the substrate 12.

Figure 3:
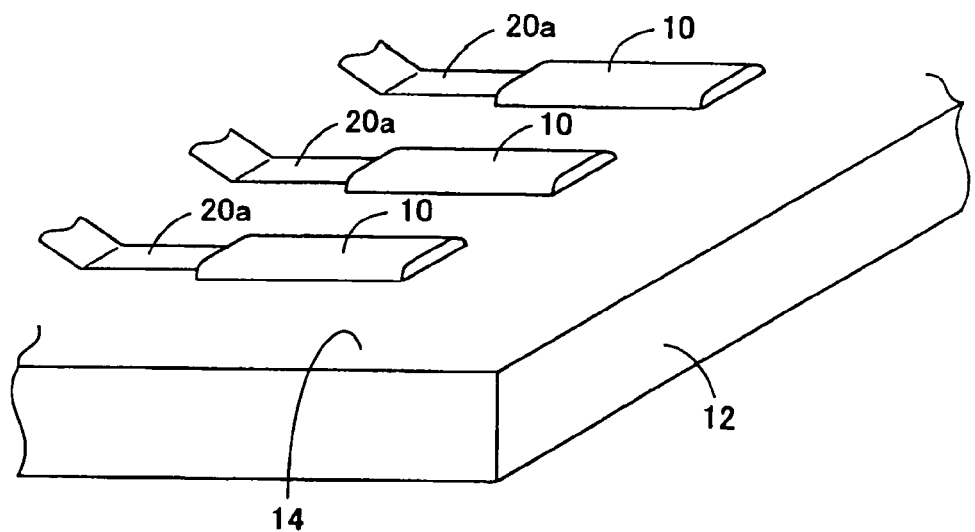
FIG. 3 is a perspective view schematically showing a state where conductive paste films are provided for describing a mode in which the conductive films according to another embodiment of the present invention are covered with a glass film.
Figure 4:
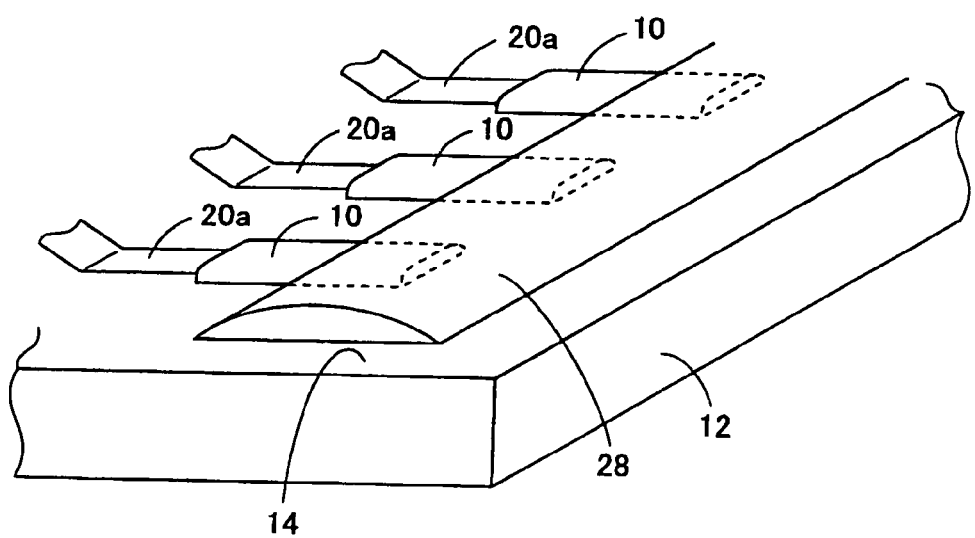
FIG. 4 is a perspective view schematically showing a state where a glass paste film for covering the conductive paste film is provided, subsequent to FIG. 3.

FIGS. 3 and 4 are diagrams each describing a principal arrangement of a VFD according to another embodiment to which a conductive composition and a conductive paste of the present invention are applied. In FIG. 3, leg portions 20a of grid electrodes 20 are fixed onto a surface 14 of a substrate 12 via island fixing type conductive layers 10 by performing the steps described above. In other words, the leg portions 20a are fixed only by the island fixing type conductive layers 10 in this manner.

On the other hand, in the mode shown in FIG. 4, a glass covering layer 28 is formed so as to partially cover a surface 14 of a substrate 12. This glass covering layer 28 is formed as follows, for example. After having performed the above-described drying step, prior to the calcining step, a glass paste is applied and dried, and then calcined simultaneously with the island, fixing type conductive layers 10, thus the glass covering layer 28 being formed. As the above-described glass paste, the one containing for example only BCA as the solvent, and not containing terpineol solvent is suitably used.

According to such the mode, since the island fixing type conductive layer 10 contains no Ag powders, etc., its fixation strength increases owing to the glass covering layer 28 having the high fixing property. Thus, compared with the case where no glass covering layer 28 is provided, the adhesiveness between each leg portion 20a and the wiring layer 16 increases. Therefore, obtained is the VFD in which not only the contact resistance is further reduced with certainty, but the detachment or peel-off of the grid electrodes 20 and resistance value increase are further unlikely to occur even upon application of oscillation during the manufacturing process and/or during use.

In providing the glass covering layer 28 as described above, according to the present embodiment, the vehicle serving as the constituent element of the conductive paste for forming the island fixing type conductive layers 10, contains ethylcellulose and rosin resin as the resin components, and contains BCA and terpineol as the solvent components. On the other hand, the glass paste for forming the glass covering layer 28 contains only BCA as the solvent component. Accordingly, the conductive paste film, prepared by performing a drying process on the conductive paste, will not be re-dissolved even if the glass paste is applied thereon.

Specifically, the rosin resin contained in the conductive paste, being dissolved in a terpineol solvent, is suitably dissolved in the conductive paste, but is hardly dissolved in the glycol solvent such as BCA. Therefore, once the rosin resin is hardened, it will not be dissolved even if the glass paste containing only BCA as the solvent is applied thereon.

As a result, as shown in FIG. 4, the original shape of each island fixing type conductive layer 10 is maintained without causing the dissolving or deformation thereof even if the glass covering layer 28 is provided. As a result, a short circuit between the island fixing type conductive layer 10 and the adjacent pattern, that is an electrical leak therebetween will not occur, thus suitably reinforcing the fixation strength.

Incidentally, in the case where no rosin resin is mixed as the resin component in the conductive paste and/or BCA terpineol are contained as solvent components in the glass paste, when the glass paste is applied thereon after application and drying of the conductive paste, the resin in the conductive paste film is re-dissolved. Therefore, the conductive paste film fluidized deforms, and is brought into contact with or combined with the adjacent conductive paste film, that is the adjacent conductive paste films are electrically short-circuited in the worst case.

Figure 5:
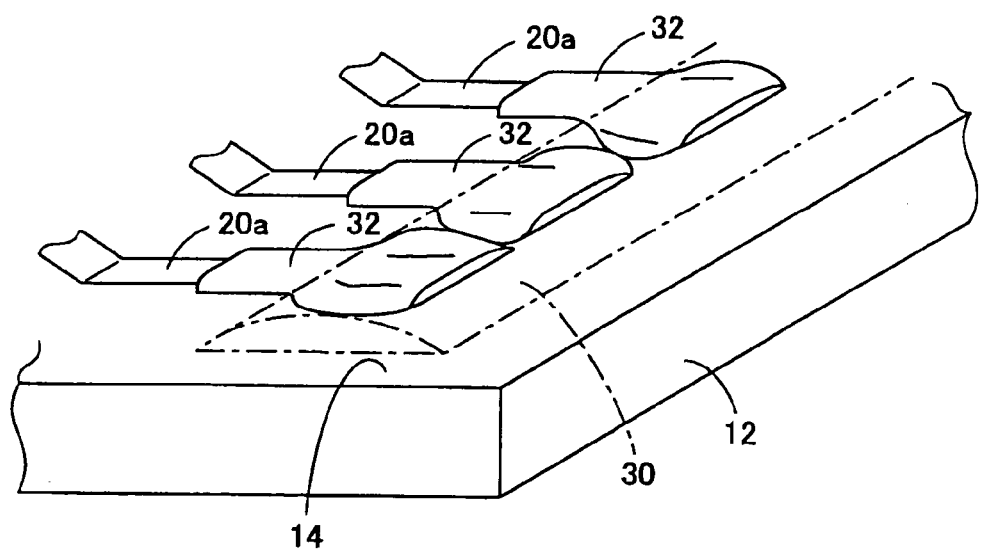
FIG. 5 is a perspective view describing the problem in a case where a conventional conductive paste is used in the mode shown in FIGS. 3 and 4.

FIG. 5 schematically shows a state where the island fixing type conductive layers 32 deform due to formation of a glass covering layer 30 as indicated by the alternate long and short dash lines, and the adjacent island fixing type conductive layers 32 are brought into contact with each other. As described above, such the problem might occur in the case where the resin component within the conductive paste dissolves in the solvent component within the glass paste.

Following Table 1, Table 2 and Table 3 summarize evaluation results on the respective characteristics of the island fixing type conductive layers partially covered with the glass covering layer formed by the conductive composition and the conductive paste of the present invention, which are obtained by variously changing the compositions thereof. In the Tables 1 through 3, "Example" means an example within the scope of the present invention, while "Comparative Example" means a comparative example outside the scope of the present invention. Moreover, the rows "Ag" through "Vehicle D" show the prepared compositions of the respective examples and comparative examples by weight percentage. The compositions of "Vehicle A" through "Vehicle D" are shown in Table 4. Noted is that in the Tables 1 to 4, "Example" is abbreviated as "Ex", "Comparative Example" is abbreviated as "Com".

TABLE 1

| (wt %) | Com. 1 | Ex. 1 | Ex. 2 | Ex. 3 | Ex. 4 | Ex. 5 | Com. 2 | Com. 3 | Ex. 6 |
|---|---|---|---|---|---|---|---|---|---|
| Ag | 19.0 | 20.0 | 30.0 | 33.0 | 50.0 | 70.0 | 30.0 | 71.0 | 20.0 |
| Glass | 26.5 | 26.0 | 18.0 | 18.0 | 16.0 | 10.0 | 18.0 | 9.5 | 35.0 |
| Filler: ZWP | 26.5 | 26.0 | 21.0 | 21.0 | 20.0 | 10.0 | 0.0 | 9.5 | 35.0 |

TABLE 1-continued

| (wt %) | Com. 1 | Ex. 1 | Ex. 2 | Ex. 3 | Ex. 4 | Ex. 5 | Com. 2 | Com. 3 | Ex. 6 |
|---|---|---|---|---|---|---|---|---|---|
| Filler: Zircon | 0.0 | 0.0 | 0.0 | 0.0 | 0.0 | 0.0 | 21.0 | 0.0 | 0.0 |
| Reducing Agent | 5.0 | 5.0 | 5.0 | 5.0 | 5.0 | 5.0 | 5.0 | 0.0 | 0.0 |
| Al | 0.0 | 0.0 | 3.0 | 0.0 | 0.0 | 0.0 | 3.0 | 0.0 | 0.0 |
| Pigment | 4.0 | 4.0 | 4.0 | 4.0 | 0.0 | 0.0 | 4.0 | 0.0 | 0.0 |
| Vehicle A | 19.0 | 19.0 | 19.0 | 19.0 | 14.0 | 10.0 | 19.0 | 10.0 | 10.0 |
| Vehicle B | 0.0 | 0.0 | 0.0 | 0.0 | 0.0 | 0.0 | 0.0 | 0.0 | 0.0 |
| Vehicle C | 0.0 | 0.0 | 0.0 | 0.0 | 0.0 | 0.0 | 0.0 | 0.0 | 0.0 |
| Vehicle D | 0.0 | 0.0 | 0.0 | 0.0 | 0.0 | 0.0 | 0.0 | 0.0 | 0.0 |
| Total (%) | 100.0 | 100.0 | 100.0 | 100.0 | 100.0 | 100.0 | 100.0 | 100.0 | 100.0 |
| Substrate Crack | Δ | ⊚ | ⊚ | ⊚ | ⊚ | ⊚ | ⊚ | ⊚ | ⊚ |
| Cracking | ○ | ○ | ⊚ | ⊚ | ⊚ | ○ | ○ | Δ | ○ |
| Resistance Value | x | ○ | ⊚ | ⊚ | ⊚ | ○ | x | Δ | ○ |
| Bonding Strength | ⊚ | ⊚ | ⊚ | ⊚ | ⊚ | ○ | ○ | x | ⊚ |
| Conductive Leak | ⊚ | ⊚ | ⊚ | ⊚ | ⊚ | ○ | ⊚ | ○ | ○ |

TABLE 2

| (wt %) | Ex. 7 | Com. 4 | Ex. 8 | Com. 5 | Ex. 9 | Ex. 10 | Com. 6 | Ex. 11 | Ex. 12 |
|---|---|---|---|---|---|---|---|---|---|
| Ag | 20.0 | 20.0 | 20.0 | 20.0 | 30.0 | 30.0 | 30.0 | 30.0 | 30.0 |
| Glass | 55.5 | 56.0 | 15.0 | 14.0 | 18.0 | 15.0 | 18.0 | 18.0 | 18.0 |
| Filler: ZWP | 15.0 | 14.0 | 55.0 | 56.0 | 21.0 | 17.0 | 21.0 | 21.0 | 21.0 |
| Filler: Zircon | 0.0 | 0.0 | 0.0 | 0.0 | 0.0 | 0.0 | 0.0 | 0.0 | 0.0 |
| Reducing Agent | 0.0 | 0.0 | 0.0 | 0.0 | 10.0 | 5.0 | 5.0 | 5.0 | 5.0 |
| Al | 0.0 | 0.0 | 0.0 | 0.0 | 0.0 | 10.0 | 3.0 | 3.0 | 3.0 |
| Pigment | 0.0 | 0.0 | 0.0 | 0.0 | 2.0 | 4.0 | 4.0 | 4.0 | 4.0 |
| Vehicle A | 10.0 | 10.0 | 10.0 | 10.0 | 19.0 | 19.0 | 0.0 | 0.0 | 0.0 |
| Vehicle B | 0.0 | 0.0 | 0.0 | 0.0 | 0.0 | 0.0 | 19.0 | 0.0 | 0.0 |
| Vehicle C | 0.0 | 0.0 | 0.0 | 0.0 | 0.0 | 0.0 | 0.0 | 19.0 | 0.0 |
| Vehicle D | 0.0 | 0.0 | 0.0 | 0.0 | 0.0 | 0.0 | 0.0 | 0.0 | 19.0 |
| Total (%) | 100.0 | 100.0 | 100.0 | 100.0 | 100.0 | 100.0 | 100.0 | 100.0 | 100.0 |
| Substrate Crack | ⊚ | x | ⊚ | ⊚ | ⊚ | ⊚ | ⊚ | ⊚ | ⊚ |
| Cracking | ○ | x | ○ | ○ | ⊚ | ⊚ | ⊚ | ⊚ | ⊚ |
| Resistance Value | ○ | ○ | ○ | Δ | ⊚ | ⊚ | ⊚ | ⊚ | ⊚ |
| Bonding Strength | ⊚ | ⊚ | ○ | x | ⊚ | ⊚ | ⊚ | ⊚ | ⊚ |
| Conductive Leak | ○ | ○ | ○ | ○ | ⊚ | ⊚ | x | ○ | ⊚ |

TABLE 3

| (wt %) | Com. 7 | Com. 8 | Com. 9 | Com. 10 | Com. 11 | Com. 12 |
|---|---|---|---|---|---|---|
| Ag | 30.0 | 35.0 | 20.0 | 30.0 | 30.0 | 35.0 |
| Glass | 29.0 | 29.0 | 55.0 | 18.0 | 29.0 | 29.0 |
| Filler: ZWP | 0.0 | 0.0 | 0.0 | 0.0 | 0.0 | 0.0 |
| Filler: Zircon | 10.0 | 5.0 | 15.0 | 0.0 | 0.0 | 0.0 |
| Filler: ZP | 0.0 | 0.0 | 0.0 | 21.0 | 10.0 | 5.0 |
| Reducing Agent | 5.0 | 5.0 | 0.0 | 5.0 | 5.0 | 5.0 |
| Al | 3.0 | 3.0 | 0.0 | 3.0 | 3.0 | 3.0 |
| Pigment | 4.0 | 4.0 | 0.0 | 4.0 | 4.0 | 4.0 |
| Vehicle A | 19.0 | 19.0 | 10.0 | 19.0 | 19.0 | 19.0 |
| Vehicle B | 0.0 | 0.0 | 0.0 | 0.0 | 0.0 | 0.0 |
| Vehicle C | 0.0 | 0.0 | 0.0 | 0.0 | 0.0 | 0.0 |
| Vehicle D | 0.0 | 0.0 | 0.0 | 0.0 | 0.0 | 0.0 |
| Total (%) | 100.0 | 100.0 | 100.0 | 100.0 | 100.0 | 100.0 |
| Substrate Crack | Δ | x | x | ⊚ | Δ | x |
| Cracking | ○ | ○ | ○ | ○ | ○ | ○ |
| Resistance Value | ○ | ⊚ | x | x | ○ | ⊚ |
| Bonding Strength | ○ | ⊚ | ⊚ | ○ | ○ | ⊚ |
| Conductive Leak | ⊚ | ⊚ | ○ | ⊚ | ⊚ | ⊚ |

TABLE 4

| (w/t part) | Vehicle A | Vehicle B | Vehicle C | Vehicle D |
|---|---|---|---|---|
| Ethylcellulose | 21.5 | 23.0 | 24.0 | 24.0 |
| Polymerized Rosin | 5.8 | 0.0 | 0.0 | 2.6 |
| Rosin Ester | 5.8 | 0.0 | 0.5 | 2.6 |
| BCA | 27.0 | 27.0 | 27.0 | 27.0 |

TABLE 4-continued

| (w/t part) | Vehicle A | Vehicle B | Vehicle C | Vehicle D |
|---|---|---|---|---|
| Terpineol | 27.0 | 27.0 | 27.0 | 27.0 |
| Plasticizer | 8.0 | 8.0 | 8.0 | 8.0 |
| Others | 11.0 | 15.0 | 15.0 | 13.0 |
| Total | 106.1 | 100.0 | 101.5 | 104.2 |
| Rosin in resin (wt %) | 35.0 | 0.0 | 2.0 | 17.8 |
| EC in resin (wt %) | 65.0 | 100.0 | 98.0 | 82.2 |

In the Tables 1 through 3, the rows "Substrate Crack" through "Conductive Leak" represent the evaluation results on the respective characteristics, which are obtained by providing the island fixing type conductive layers and the glass covering layer. In the rows "Substrate Crack," shown are the evaluation results indicating the presence of the substrate crack 24 shown in FIG. 2. More specifically, an evaluation dot with 2(mm) □ (square) is arbitrarily determined at ten spots, among which the number of the spots where a crack occurs is visually counted and evaluated. The evaluation result "⊚" signifies that no crack is observed, the evaluation result "Δ" signifies that a crack is observed at one of the ten spots, and the evaluation result "x" signifies that cracks are observed at two or more of the ten spots. In any of the evaluation items, "⊚" and "○" each represent a non-defective product, while "Δ" and "x" each represent a defective product.

In the rows "Cracking," shown are the evaluation results indicating the presence of the cracking 26 in the island fixing type conductive layer shown in FIG. 2. More specifically, similar to the evaluation on the substrate crack, an evaluation dot with 2 (mm) square is arbitrarily determined at ten spots, among which the number of the spots where a cracking occurs is visually counted and evaluated. The evaluation result "⊚" signifies that no cracking is observed, the evaluation result "○" signifies that cracking is observed at one of the ten spots, the evaluation result "Δ" signifies that crackings are observed at two of the ten spots, and the evaluation result "x" signifies that crackings are observed at three or more of the ten spots.

In the rows "Resistance Value," shown are the evaluation results obtained by measuring the resistance value over the substrate 12 from the wiring layer 16 to the grid electrode 20 via the island fixing type conductive layer using a tester, so as to substantially evaluate the magnitude of the resistance value of the island fixing type conductive layer. The evaluation result "⊚" signifies measurement of resistance value of 1(Ω) or less, the evaluation result "○" signifies measurement of resistance value of less than 50(Ω), the evaluation result "Δ" signifies measurement of resistance value of less than 100 (Ω), and the evaluation result "x" signifies measurement of resistance value of 100(Ω) or more.

In the rows "Bonding Strength," shown are the evaluation results obtained by measuring the tensile strength, which has led to detachment, by a tensile test. Specifically, the mesh-like grid electrode 20, having the outer size of a bonded part of approximately 2 (mm) square, and being provided with internally arranged rectangle holes of approximately 150 (μm) square at intervals of approximately 200 (μm), is fixed onto the surface 14 of the substrate 12. The grid electrode is vertically pulled with respect to the surface 14. The evaluation result "⊚" signifies measurement of a tensile strength of 200 (gf) or more, i.e., 1.96(N) or more, the evaluation result "○" signifies measurement of a tensile strength of 100 (gf) or more, i.e., 0.98(N) or more, and the evaluation result "x" signifies measurement of a tensile strength of less than 100 (gf), i.e., less than 0.98(N).

In the rows "Conductive Leak," shown are the evaluation results obtained by evaluating the deformation degree of the island fixing type conductive layer covered with the glass covering layer, after the calcining process for the substrate 12, for example. As described above, if the island fixing type conductive layer is fluidized and deformed due to re-dissolving of its resin component, one island fixing type conductive layer deformed is combined with the adjacent island fixing type conductive layer, etc. Thus, the short-circuit occurs which might cause a conductive leak.

In consideration of this, the evaluation result "⊚" signifies that no deformation is observed whatsoever, the evaluation result "○" signifies the island fixing type conductive layer deforms but it is not brought into contact with the adjacent one. The evaluation result "x" signifies that the deformation degree is severe to be brought into contact with the adjacent one, so that conductive leak occurred.

In the Tables 1 through 3, the Comparative Examples 1, 3 and the Examples 1 through 5 are composition examples prepared to reveal the upper and lower limits of the contained amount of Ag. As shown in the Comparative Example 1, 19 (wt %) of Ag which is excessively small amount invites the resistance value of 100(Ω) or more which is significantly high. Furthermore, as shown in the Comparative Example 3, 71.0 (wt %) of Ag which is excessively large amount invites relative shortage of the glass amount, thus the bonding strength being reduced. As a result, cracking occurred in the island fixing type conductive layer, and the resistance value eventually increased.

On the other hand, in any of the Examples 1 through 5 in which the Ag amount is 20 to 70 (wt %), the resistance value remains as low as less than 50(Ω), thus sufficient conductivity being obtained. In particular, in the Examples 2 through 4 where the Ag amount is selected 30 to 50 (wt %), the resistance value reduces to an extremely low value of 1(Ω) or less to obtain the high conductivity.

Furthermore, in the composition of the Comparative Example 2 corresponding to that of the Example 2, instead of the ZWP, the zircon is used as the filler for reducing the thermal expansion coefficient. The added amount of the filler is selected 21 (wt %) as in the Example 2. In the Comparative Example 2, under inhibition of the substrate crack, the resistance value reaches as high as 100(Ω) or more, e.g., in the order of 1 (MΩ). In the Comparative Example 7, the zircon is used as the filler, but the added amount thereof is selected smaller than that in the Comparative Example 2. Owing to the small added amount of the filler, the resistance value reduces to a value less than 100(Ω) to improve the conductivity, but the substrate crack occurs because of the decreased thermal expansion adjusting effect of the filler.

In the Comparative Example 8, the added amount of the filler is further selected smaller than that in the Comparative Example 7, and the contained amount of Ag serving as the conductive component is selected larger than that in the Comparative Example 7 in an attempt to further improve the conductivity. In this composition, despite the resistance value reduces to 1(Ω) or less, the substrate crack significantly occurs, which makes obtaining a stable conductivity difficult. From these facts, using the zircon as the filler with difficulty achieves compatibility between the conductivity and the thermal expansion coefficient.

In the composition of the Comparative Example 10 corresponding to that of the Example 2, instead of the ZWP, the zirconia phosphate (hereinafter, called as "ZP") is used as the filler. The added amount of the filler is 21 (wt %) as in the Example 2. This composition corresponds to that in the Example 2. Furthermore, in the Comparative Examples 11 and 12 corresponding to the Comparative Examples 7 and 8 in composition, respectively, instead of the zircon, the ZP is used as the filler. In the Comparative Example 11, the added amount of the filler is 10 (wt %) as in the Comparative Example 7, and in the Comparative Example 12, the added amount of the filler is 5 (wt %) as in the Comparative Example 8.

According to the Comparative Examples 10 through 12 in which the ZP is used as the filler, the substrate crack and the resistance value are at favorable levels slightly compared with the Comparative Examples 2, 7 and 8 in which zircon is used as the filler. In other words, the thermal expansion adjusting effect and conductivity improving effect of the ZP is slightly higher than those of the zircon. However, as shown in the Table 3, the characteristic evaluation results of the Comparative Examples 2, 7 and 8 are similar to those of the Comparative Examples 10, 11 and 12, respectively, which means that the resistance value increases in pursuing non-occurrence of the substrate crack, while occurrence of the substrate crack is inevitable in pursuing increase in the conductivity. After all, even if ZP is used as the filler, it can hardly achieve the compatibility between the conductivity and the thermal expansion coefficient as in the case where zircon is used.

Furthermore, the Examples 6, 7 and the Comparative Examples 3, 4 are composition examples prepared to reveal the upper and lower limits of the contained amount of low-melting glass. As shown in Comparative Example 3, if the contained amount of glass reduces to 9.5 (wt %) because of the low thermal expansion coefficient of the overall composition, so that the substrate crack resulting from thermal expansion incompatibility will not occur. However, the bonding strength of the island fixing type conductive layer to the substrate 12 becomes deficient, and the deficient mutual connection properties of silver powders generates cracking in the conductive layer to rather increase the resistance value.

Furthermore, as shown in the Comparative Example 4, if the contained amount of glass reaches 56 (wt %), the thermal expansion coefficient cannot be sufficiently reduced even if the low-expansion filler is added, so that both the substrate crack and the island fixing type conductive layer cracking occur due to the thermal expansion incompatibility with the substrate 12. As shown in the Examples 6 and 7, if the contained amount of glass is in the range of 35 to 55 (wt %), neither substrate crack nor cracking occurs.

As shown in the Examples 5 and 8, even if the contained amount of glass is 10 to 15 (wt %), the respective characteristics are at acceptable levels, but the bonding strength is slightly deficient and cracking might also be observed. In view of this, the glass amount is preferably selected 16 (wt %) or more.

The Example 8 and the Comparative Example 5 are provided to ascertain the upper limit of the filler amount. As shown in the Comparative Example 5, if the contained amount of the filler reaches 56 (wt %), the substrate crack will not occur, but the cracking is slightly likely to occur resulted from the deficient bonding strength, and the resistance value increases. Since the cracking and the bonding strength deficiency are observed if the contained amount of the filler is selected 10 to 15 (wt %) as shown in the Examples 5 and 7, the filler amount is further preferably selected 16 (wt %) or more. In the composition of the Comparative Example 9 corresponding to that of the Example 7, instead of the ZWP, the zircon is used as the filler. Even in such the composition in which the glass amount increases, usage of the zircon reduces the substrate crack significantly, and the resistance value increases if the zircon is used.

In the Examples 9 and 10 in which the added amounts of the reducing agent and Al powders (i.e., shrinkage inhibitor) increase respectively, no problem particularly occurs if the added amounts thereof are each up to 10 (wt %). Increase of the added amounts relatively reduces the contained amounts of Ag, glass and filler which are main components, and therefore renders no advantage.

In the compositions of the Comparative Example 6, Examples 11 and 12, each corresponding to that of the Example 2, the vehicle composition is varied. As shown in the Table 4, the ratio of rosin resin to the whole resin amount is respectively 35 (wt %) in the Vehicle A, 0 (wt %) in the Vehicle B, and remains at 2 (wt %) in the Vehicle C. In the Vehicle D, the rosin resin amount is between that of the Vehicle A and that of the Vehicle C. In the Vehicles A and D, as the rosin resin, polymerized rosin and rosin ester are used in combination. In the Vehicle C, no polymerized rosin is used. In any of the vehicles, the rosin ester is rosin ester maleate.

As will be apparent from the comparison between the Examples 2, 11, 12 and the Comparative Example 6, the resin in the island fixing type conductive layer is re-dissolved and conductive leak occurred in the Comparative Example 6 in which the Vehicle B containing no rosin resin is used. On the other hand, in the Examples 2, 11 and 12 in which the Vehicles A, C and D containing rosin resin are respectively used, no conductive leak occurred irrespective of difference in the contained ratio of the rosin resin. Accordingly, in the arrangement including the glass covering layer, the composition containing rosin resin is essential.

Noted is that, in the Example 11 using the Vehicle C in which the ratio of rosin resin remains at 2 (wt %), no conductive leak is caused but the deformation of the island fixing type conductive layer is observed. Thus, the ratio of rosin resin to the whole resin amount must be 2 (wt %) or more, which means the upper limit of the ratio of ethylcellulose relative to the whole resin amount is preferably selected 98 (wt %). Moreover, taking no problem having occurred even if rosin resin occupies 35 (wt %) as in the Vehicle A into consideration, the ratio of ethylcellulose to the whole resin amount may also be reduced to 65 (wt %).

The present invention is described above in detail with reference to the drawings. Noted is that the present invention may also be implemented in other modes, and may be variously modified without departing from the gist of the present invention.

What is claimed is:

1. A conductive composition, comprising:
   Ag contained in the range from 20 to 70 wt %;
   $Bi_2O_3$—$B_2O_3$ base low-melting glass contained in the range from 10 to 55 wt %; and
   zirconium tungstophosphate contained in the range from 20 to 26 wt %.

2. The conductive composition according to claim 1, wherein the Ag is contained in the range from 30 to 50 wt %.

3. The conductive composition according to claim 1, wherein the $Bi_2O_3$—$B_2O_3$ base low-melting glass is contained in the range from 16 to 26 wt %.

4. The conductive composition according to claim 1, wherein the Ag, the $Bi_2O_3$—$B_2O_3$ base low-melting glass and the zirconium tungstophosphate are contained at 90 wt % or more in total.

5. The conductive composition according to claim 1, wherein the Ag has an average particle diameter in the range from 1 to 10 μm.

6. The conductive composition according to claim 1, wherein the zirconium tungstophosphate has an average particle diameter in the range from 1 to 50 μm.

7. The conductive composition according to claim 1, further comprising a reducing agent in the range from 5 to 10 wt %.

8. The conductive composition according to claim 1, wherein the composition further contains a pigment in the range of 10 wt % or less.

9. A conductive paste, comprising:
a vehicle containing ethylcellulose in the range of 65 to 98 wt % with respect to a whole resin, and rosin resin in the range from 2 to 35 wt % relative to the whole resin; and
a conductive composition that is dispersed in the vehicle, the conductive composition comprising:
Ag contained in the range from 20 to 70 wt %;
$Bi_2O_3$—$B_2O_3$ base low-melting glass contained in the range from 10 to 55 wt %; and
zirconium tungstophosphate contained in the range from 10 to 55 wt %.

10. A conductive paste, comprising:
a vehicle containing ethylcellulose in the range of 65 to 98 wt % with respect to a whole resin, and rosin resin in the range from 2 to 35 wt % relative to the whole resin, the rosin resin containing both rosin ester and polymerized rosin; and
a conductive composition that is dispersed in the vehicle, the conductive composition comprising:
Ag contained in the range from 20 to 70 wt %; $Bi_2O_3$—$B_2O_3$ base low-melting glass contained in the range from 10 to 55 wt %; and
zirconium tungstophosphate contained in the range from 10 to 55 wt %.

* * * * *